US010674636B2

(12) United States Patent
Marroquin et al.

(10) Patent No.: US 10,674,636 B2
(45) Date of Patent: Jun. 2, 2020

(54) INSTALLATION TOOL FOR FLEXIBLE ELEMENTS

(71) Applicant: International Business Machines Corporation, Armonk, NY (US)

(72) Inventors: Christopher M. Marroquin, Rochester, MN (US); Scott A. Shurson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 361 days.

(21) Appl. No.: 15/586,107

(22) Filed: May 3, 2017

(65) Prior Publication Data

US 2018/0324984 A1 Nov. 8, 2018

(51) Int. Cl.
*H05K 7/20* (2006.01)

(52) U.S. Cl.
CPC ..... *H05K 7/20772* (2013.01); *H05K 7/20254* (2013.01)

(58) Field of Classification Search
CPC ........................ H05K 7/20254; H05K 7/20772
See application file for complete search history.

(56) References Cited

U.S. PATENT DOCUMENTS

| 4,758,924 A * | 7/1988 | Dillon ................ H05K 7/20554 361/692 |
| 5,001,601 A | 3/1991 | Fuoco |
| 6,687,126 B2 | 2/2004 | Patel et al. |
| 6,829,142 B2 | 12/2004 | Belady et al. |
| 6,992,247 B2 * | 1/2006 | Rasmussen ............. G06F 1/189 174/494 |
| 7,293,666 B2 * | 11/2007 | Mattlin ................... G06F 1/181 211/189 |

(Continued)

FOREIGN PATENT DOCUMENTS

| CN | 204350519 U | 5/2015 |
| JP | 63275199 A | 11/1988 |

OTHER PUBLICATIONS

IBM, Messina, GP and Simmons, RH "Cold Plate Hat with Oil Interface Tool Remover," An IP.com Prior Art Database Technical Disclosure, Sep. 1, 1992, 3 pages.

(Continued)

*Primary Examiner* — Carl J Arbes
(74) *Attorney, Agent, or Firm* — Patterson + Sheridan, LLP

(57) ABSTRACT

A method and apparatuses are provided for removing a cold plate assembly from an electronics enclosure. The apparatus includes a chassis configured to be placed on the electronics housing in an aligned manner. The chassis includes a plurality of brackets disposed on the chassis. The respective ones of the plurality of brackets are configured to be attached to respective electrical components in the electronics housing. The respective ones of the plurality of brackets are also configured to be disposed on the chassis at locations corresponding to the locations of the respective electrical components within the electronics housing when the chassis is aligned with the electronics housing. The respective ones of the plurality of brackets are also configured to selectively movable between a first orientation and a second orientation. The respective brackets are closer to the respective electrical components in the first orientation than in the second orientation.

20 Claims, 13 Drawing Sheets

(56) References Cited

U.S. PATENT DOCUMENTS

| | | | |
|---|---|---|---|
| 7,295,440 B2 | 11/2007 | Ganev et al. | |
| 7,472,970 B2 * | 1/2009 | Bergesch | G06F 1/181 211/26 |
| 7,488,202 B2 * | 2/2009 | Spitaels | H01R 13/741 439/532 |
| 7,830,664 B2 | 11/2010 | Campbell et al. | |
| 7,974,105 B2 * | 7/2011 | Dean, Jr. | H04Q 1/062 361/826 |
| 8,210,490 B2 * | 7/2012 | Mattlin | G06F 1/181 248/558 |
| 10,182,651 B2 * | 1/2019 | Jost | A47B 57/54 |
| 2003/0121689 A1 * | 7/2003 | Rasmussen | G06F 1/189 174/50 |
| 2010/0128431 A1 | 5/2010 | Eriksen et al. | |

OTHER PUBLICATIONS

Disclosed Anonymously, "Cold Plate Manifold Hanger Tool," An IP.com Prior Art Database Technical Disclosure, IP.com No. IPCOM000235644D, IP.com Electronic Publication Date: Mar. 17, 2014, 3 pages.

Reilly et al., "A Novel, Autonomous Termal Connector," 29th IEEE Semi-Therm Symposium, 2013, 5 pages.

Semiconductor Thermal Measurement and Management Symposium (Semi-Therm), 2013 29th Annual IEEE Year: 2013, pp. 256-260, DOI: 10.1109/SEMI-THERM.2013.6526838.

\* cited by examiner

INSTALLATION TOOL FOR FLEXIBLE ELEMENTS

BACKGROUND

In certain environments, such as in an electronics housing in a computer, components occasionally must be removed for repair or replacement. Some of the removable components are connected to each other by flexible elements, such as cables, wires, and/or hoses, and it may be impractical or impossible to disconnect the flexible elements before removing the components from the electronics housing. The flexible elements allow relative movement between the attached components when the components are not attached to the computer. Therefore, it is important that all of the removable components that are flexibly attached be controlled at all times during removal from or installation into the electronics housing to ensure a removable component does not inadvertently bump into a different component of the computer, causing damage.

SUMMARY

According to one embodiment of the present invention, an apparatus for installing components in an electronics housing is provided. The apparatus comprises a chassis comprising a plurality of tabs. Each of the tabs is configured to engage respective ones of a plurality of slots in the electronics housing. The chassis is aligned with the electronics housing when the tabs are engaged in the respective slots. The apparatus also comprises a plurality of brackets disposed on the chassis. The respective ones of the plurality of brackets are configured to be attached to respective electrical components in the electronics housing. The respective ones of the plurality of brackets are also configured to be disposed on the chassis at locations corresponding to the locations of the respective electrical components within the electronics housing when the chassis is aligned with the electronics housing. The respective ones of the plurality of brackets are also configured to be selectively movable between a first orientation and a second orientation, and wherein the respective brackets are closer to the respective electrical components in the first orientation than in the second orientation.

According to one embodiment of the present invention, a cold plate apparatus comprises a cold plate assembly. The cold plate assembly comprises a plurality of cold plates. Respective ones of the plurality of cold plates are connected to at least one other of the respective ones of the plurality of cold plates via flexible hoses. The cold plate apparatus also comprises a cold plate transport tool configured to transport the cold plate assembly to and from an electronics housing. The cold plate transport tool comprises a chassis comprising a plurality of tabs. Each of the tabs is configured to engage respective ones of a plurality of slots in the electronics housing. The chassis is aligned with the electronics housing when the tabs are engaged in the respective slots. The cold plate transport tool also comprises a plurality of brackets disposed on the chassis. The respective ones of the plurality of brackets are configured to be attached to respective ones of the plurality of cold plates. The respective ones of the plurality of brackets are also configured to be disposed on the chassis at locations corresponding to the locations of the respective electrical components within the housing when the chassis is aligned with the electronics housing. The respective ones of the plurality of brackets are also configured to be selectively movable between a first orientation and a second orientation, and wherein the respective brackets are closer to the respective cold plates in the first orientation than in the second orientation.

According to one embodiment of the present invention, a method for removing an electrical apparatus from an electronics housing is provided. The electrical apparatus includes a plurality of electrical components that are rigidly connected to electronics in the electronics housing and connected to each other via flexible members. The method comprises arranging a chassis on the electronics housing by aligning tabs on the chassis with slots in the electronics housing. The method also comprises disconnecting the electrical components from the respective electronics in the electronics housing. The method also comprises positioning respective brackets relative to the disconnected electrical components. The method also comprises attaching the disconnected electrical components to the respective bracket. The disconnected electrical components are spaced apart from remaining respective electrical components when attached to the respective brackets. The method also comprises removing the chassis, electrical components, and flexible members from the electronics housing.

DETAILED DESCRIPTION

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" or "the disclosure" shall not be construed as a generalization of any inventive subject matter disclosed herein and shall not be considered to be an element or limitation of the appended claims except where explicitly recited in a claim(s).

Figure 1A:
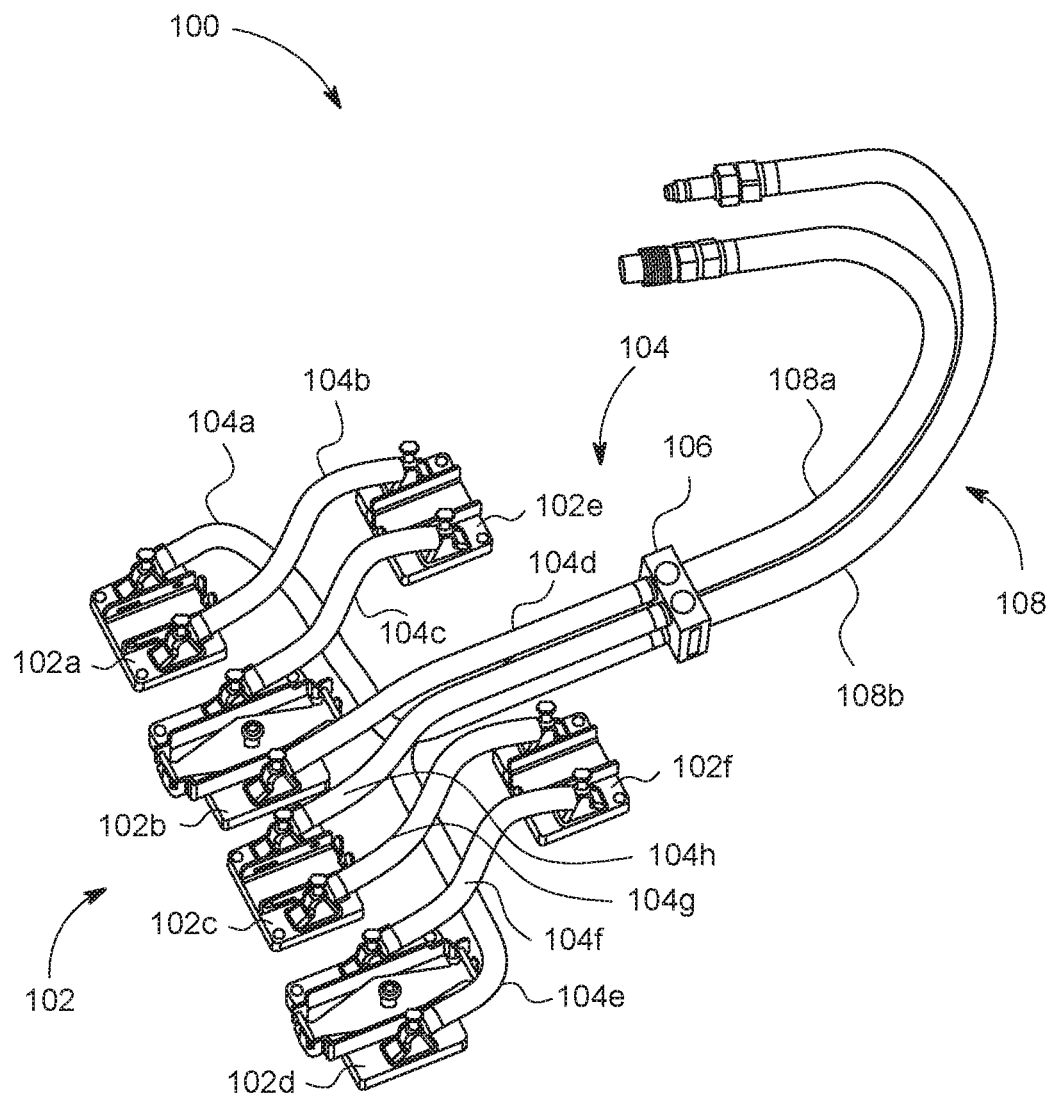
FIG. 1A is a top perspective view of a cold plate assembly.

FIG. 1A is a top perspective view of an exemplary cold plate assembly 100 that is used to cool electronics. The exemplary cold plate assembly 100 includes a plurality of cold plates 102 that are connected to each other via flexible hoses 104. Fluid, such as distilled water, water with glycol, refrigerant, and/or another suitable cooling fluid, is circulated through the plurality of cold plates 102 via the flexible hoses 104 to extract heat from electrical components, such as central processing units and/or graphical processing units, operating in an electronics enclosure (e.g., a computer case). In the exemplary cold plate assembly 100, the plurality of cold plates 102 includes a first cold plate 102a, a second cold plate 102b, a third cold plate 102c, a fourth cold plate 102d, a fifth cold plate 102e, and a sixth cold plate 102f. In the exemplary cold plate assembly 100, the flexible hoses 104 are coupled to a junction 106 and form two fluid circuits through various ones of the plurality of cold plates 102. The first fluid circuit is formed by a first flexible hose 104a from the junction 106 to the first cold plate 102a, a second flexible hose 104b from the first cold plate 102a to the fifth cold plate 102e, a third flexible hose 104c from the fifth cold plate 102e to the second cold plate 102b, and a fourth flexible hose 104d from the second cold plate 102b to the junction 106. The second fluid circuit is formed by a fifth flexible hose 104e from the junction 106 to the fourth cold plate 102d, a sixth flexible hose 104f from the fourth cold plate 102d to the sixth cold plate 102f, a seventh flexible hose 104g from the sixth cold plate 102f to the third cold plate 102c, and an eighth flexible hose 104h from the third cold plate 102c to the junction 106. The junction 106 is also coupled to supply hoses 108 that are connected to external plumbing devices, such as a fluid pump that circulates fluid through the supply hoses 108 and the flexible hoses 104, and/or a heat exchanger. Fluid passing to the junction 106 through a first supply hose 108a is split in the junction 106 to go to the first flexible hose 104a and the fifth flexible hose 104e to supply cooling fluid to the beginnings of the two above-described fluid circuits. Fluid passing to the junction 106 from the fourth flexible hose 104d and the eighth flexible hose 104h are combined in the junction 106 to go to a second supply hose 108b, which transports the fluid to the external plumbing devices.

Figure 1B:
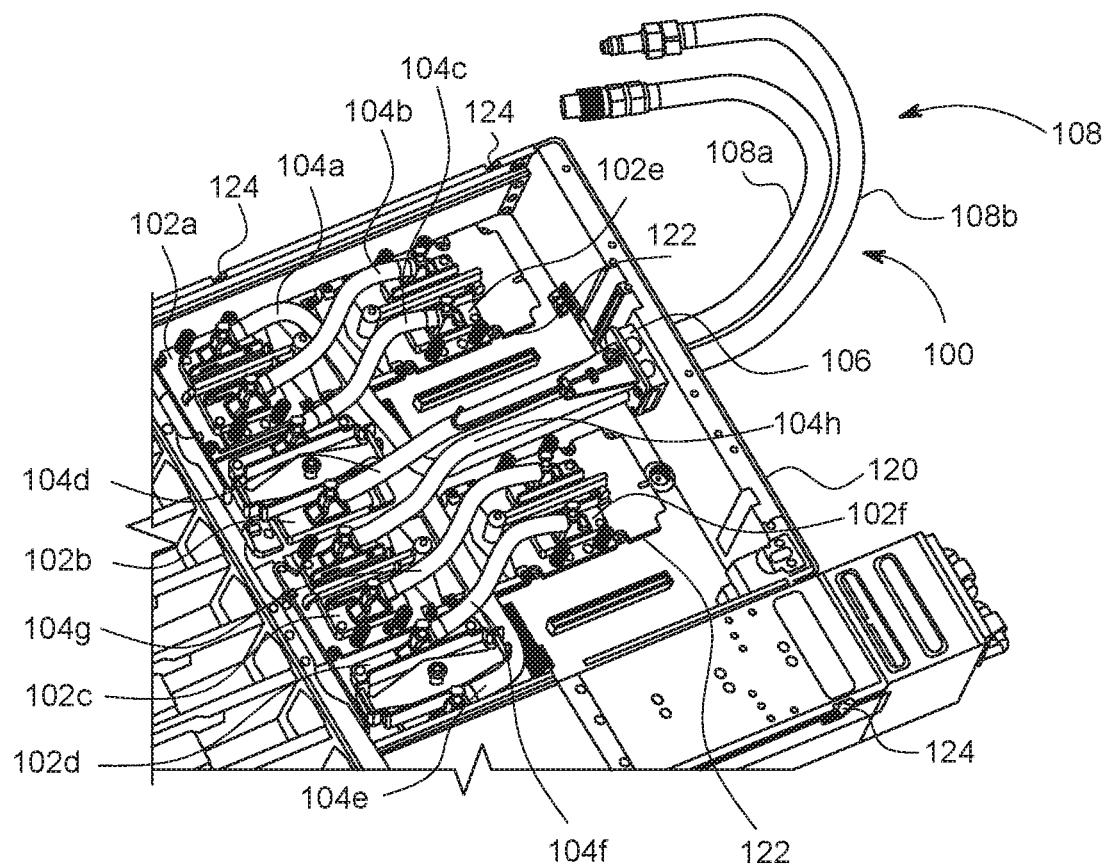
FIG. 1B is a top perspective view of the cold plate assembly of FIG. 1A installed in an electronics housing.

FIG. 1B is a top perspective view of the cold plate assembly of FIG. 1A installed in an electronics housing 120. Respective ones of the cold plates 102 are installed on various electrical components 122 within the electronics housing. The cold plates 102 are secured to the electrical components 122 via the screws, spring clamps, or other fasteners. In some circumstances, it may be necessary to remove the cold plate assembly 100 from the electronics housing 120. In such circumstances, removing the cold plate assembly 100 can be difficult because the various ones of the cold plates 102 are attached to each other via the flexible hoses 104 such that the cold plates 102 must be removed together. However, the cold plates 102 can also move relative to each other due to the flexible hoses 104 connecting them. Therefore, the individual cold plates 102 are moved in a controlled, unified manner to avoid or reduce the possibility of an uncontrolled (i.e., loose) cold plate unintentionally touching certain electronic components, which could damage those electronic components. For the cold plate assembly 100 illustrated in FIGS. 1A and 1B, at least three individuals would be needed to remove and/or reinstall the cold plate assembly 100 with respect to the electronics housing 120. For example, a first of the three individuals might hold the fifth cold plate 102e in their left hand and the first cold plate 102a in their right hand, a second of the three individuals might hold the second cold plate 102b in their left hand and the third cold plate 102c in their right hand, and a third of the three individuals might hold the fourth cold plate 102d in their left hand and the sixth cold plate 102f in their right hand. The three individuals would coordinate their actions to simultaneously lift and remove the cold plates 102 from the electronics housing 120. In certain circumstances, a fourth individual may need to control the junction 106 and the supply hoses 108 as they are pulled through the housing 120. Using three or four individuals to remove the cold plate assembly 100 from the electronics housing 120 may be inconvenient and expensive.

In embodiments described herein, a cold plate transport tool is used to secure the plurality of cold plates 102 of the cold plate assembly 100 before the cold plate assembly 100 is removed from the electronics housing 120. The cold plate transport tool enables a single individual to disconnect the plurality of cold plates 102 from the respective electronic components one at a time and secure the disconnected cold plates 102 to brackets of the cold plate transport tool. The brackets are positioned on the cold plate transport tool in a manner such that the cold plates 102 are moved only a small distance after being disconnected from the electronic components. The small distance is within the limited range of motion provided by the flexible hoses 104 connecting the cold plates 102 to other cold plates 102 or to the junction 106. After all of the cold plates 102 are disconnected from the electronic components and connected to brackets of the cold plate transport tool, the cold plate transport tool may be removed for the electronics housing, thereby removing the cold plate assembly 100 with it. Since the cold plates 102 are each fixed in place relative to the cold plate transport tool by a bracket, the cold plates 102 are moved in a controlled unified manner.

Figure 2A:
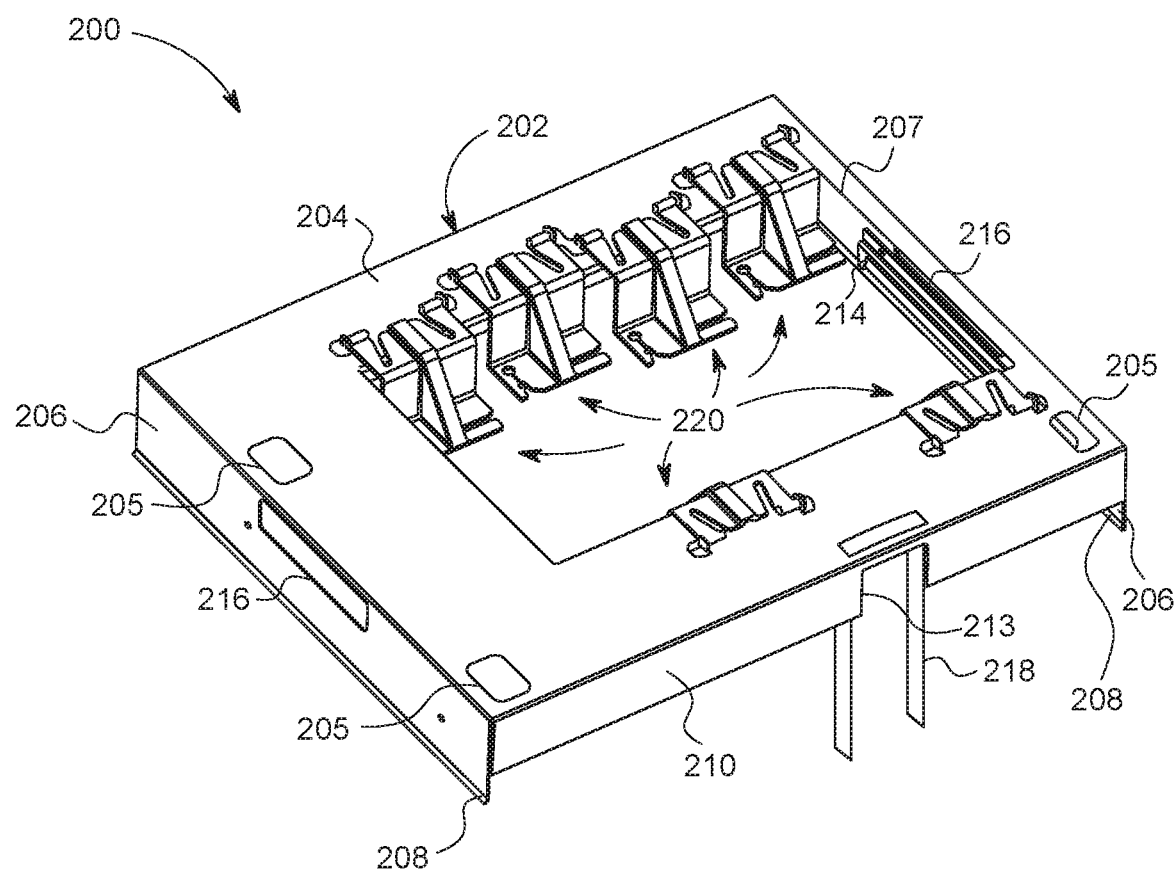
FIG. 2A is a top perspective view of a cold plate transport tool, according to one embodiment.
Figure 2B:
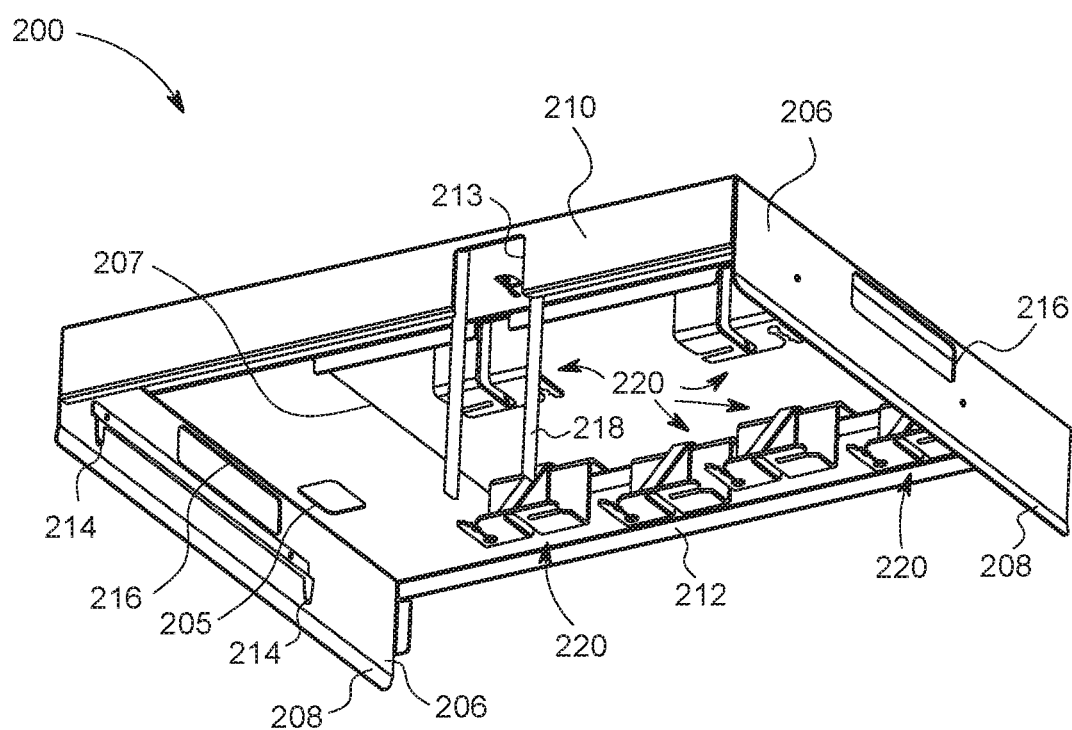
FIG. 2B is a bottom perspective view of the cold plate transport tool of FIG. 2A.

FIGS. 2A and 2B are top and bottom perspective views, respectively, of a cold plate transport tool 200 according to one embodiment. The cold plate transport tool 200 includes a chassis 202. In at least one embodiment, the chassis 202 is made of sheet steel or aluminum. The chassis 202 includes a top panel 204 and side panels 206 extending downwardly from the top panel 204. In one embodiment, the side panels 206 are formed by bending the sheet steel or aluminum. The chassis 202 also includes a first end panel 210 and a second end panel 212, wherein the first end panel 210 and the second end panel 212 extend downwardly from the top panel 204. In one embodiment, the first end panel 210 and the second end panel 212 may be formed by bending the sheet steel or aluminum.

The side panels 206, the first end panel 210, and/or the second end panel 212 engage the electronics housing 120 to align the cold plate transport tool 200 with electrical components within the electronics housing 120. For example, in one embodiment, the side panels 206 include tabs 214 configured to engage slots 124 of the computer chassis 120 (the slots 124 are illustrated in FIG. 1B). Additionally, the sidewalls 206 are spaced apart from one another such that the sidewalls 206 fit over exterior surfaces of the electronics housing 120. In one embodiment, the sidewalls 206 include flared ends 208 that facilitate alignment of the sidewalls 206 with exterior surfaces of the electronics housing 120. The first end wall 210 and/or the second end wall 212 may rest on top of surfaces of the electronics housing 120 when the cold plate transport tool 200 is placed on the electronics housing 120. The sidewalls 206 may also include cutouts 216 that can be used as handles to lift and/or position the cold plate transport tool 200. The top panel 204 of the chassis 202 may also include various windows 205 there through, which allows a user to visualize the position of the tabs 214 relative to the slots 124 in the electronics housing 120 during placement of the cold plate transport tool 200 on the electronics housing 120.

In at least one embodiment, the first end wall 210 includes an opening 213 configured to receive the supply hoses 108 and/or the junction 106. A hook and loop fastener strap 218, elastomeric band, clamp, or other securing mechanism can be disposed proximate to the opening 213. The hook and loop fastener strap 218 can be wrapped around the supply hoses 108 to secure the supply hoses 108 to the chassis 202 of the cold plate transport tool 200.

The top panel 204 of the chassis 202 also includes an opening 207 with a plurality of brackets 220 disposed around a periphery of the opening 207. The brackets 220 are configured to be attached to respective cold plates 102 of the cold plate assembly 100. Accordingly, the brackets 220 are disposed around the periphery of the opening 207 at locations corresponding to locations of the cold plates 102 in the electronics housing 120. For example, the brackets 220 may be disposed directly over the respective cold plates 102 when the cold plate transport tool 200 is arranged on the electronics housing 120. As a result, after a particular cold plate 102 is detached from electrical components in the electronics housing 120, that cold plate 102 is only moved by a small amount, relative to the remaining cold plates 102, to attach that cold plate 102 to its bracket 220. Such a relatively small amount of movement of the one cold plate 102 relative to remaining cold plates 102 can be accommodated by the flexible hoses 104.

In at least one embodiment, the chassis 202 includes a number of different attachment points for various brackets 220. Different attachment points may correspond to different locations of cold plates in different types of electronics housings 120. The brackets 220 could be removed (as discussed below with reference to FIGS. 3A-3C) and repositioned relative to the opening 207 in the chassis 202 such that the brackets 220 are aligned with the different locations of cold plates.

Figure 3A:
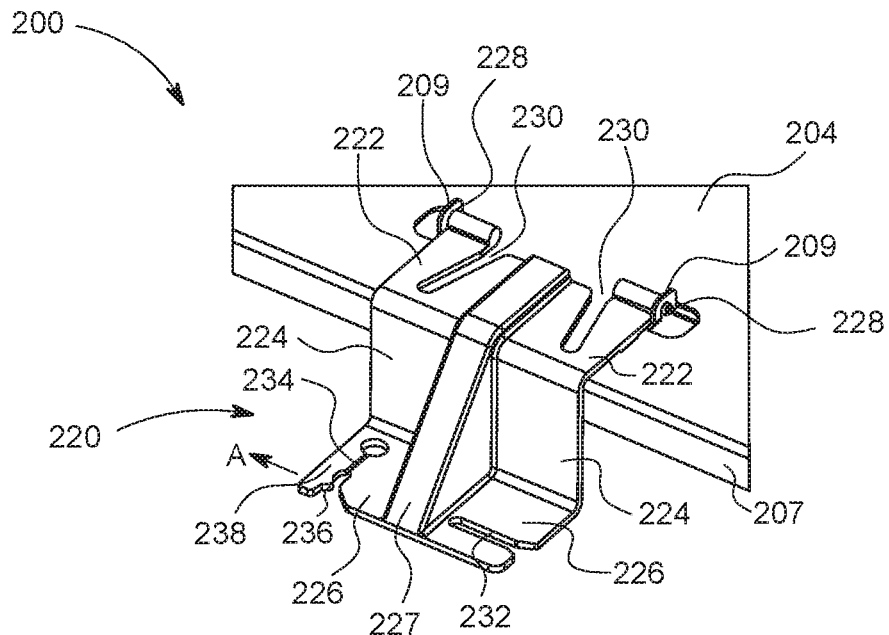
FIG. 3A is a perspective view of a bracket arranged in a first orientation on a chassis of the cold plate transport tool.

FIG. 3A is a perspective view of one of the brackets 220, according to one embodiment. The bracket 220 may be made from a plastic, a glass filled polycarbonate, or other material. The bracket 220 includes a first portion 222, a second portion 224, and a third portion 226. In the illustrated embodiment, the second portion 224 and the first portion 222 are oriented at a 90° angle and the third portion 226 and the second portion 224 are oriented at another 90° angle in the opposite direction to the first 90° angle. In the first orientation shown in FIG. 3A, the first portion 222 of the bracket 220 lies along the top panel 204 of the chassis 202 and extends over the opening 207 in the top panel 204. The 90° angle between the first portion 222 and the second portion 224 results in the second portion 224 extending through the opening 207 in the top panel 204 of the chassis 202 when the bracket 220 is in the first orientation. The opposite 90° angle between the second portion 224 and the third portion 226 results in the third portion 226 being parallel with the first portion 222. Optionally, the bracket 220 includes one or more stiffeners 227 that increase angular rigidity between the first portion 222, the second portion 224, and the third portion 226. Stated differently, the stiffeners 227 reduce flexing between the first portion 222 and the second portion 224 and/or reduce flexing between the second portion 224 and the third portion 236.

Figure 3B:
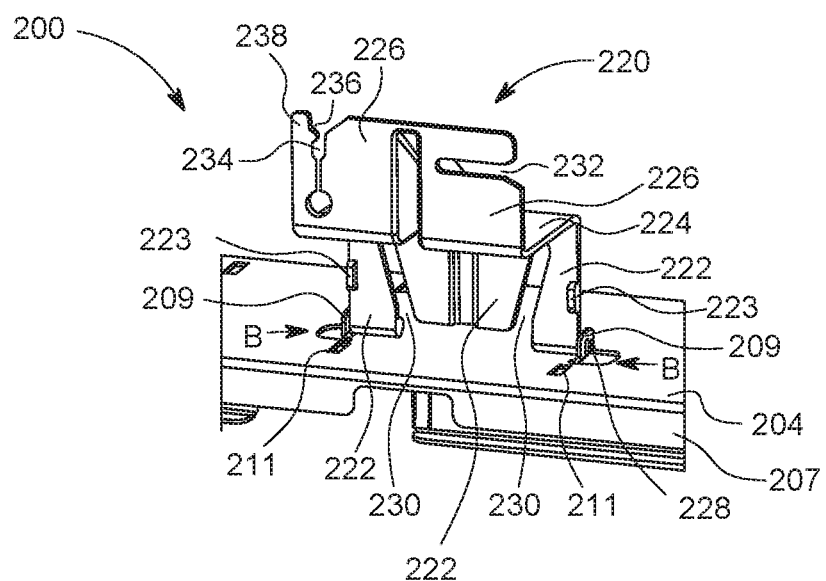
FIG. 3B is a perspective view of the bracket of FIG. 3A in a second orientation on the chassis of the cold plate transport tool.
Figure 3C:
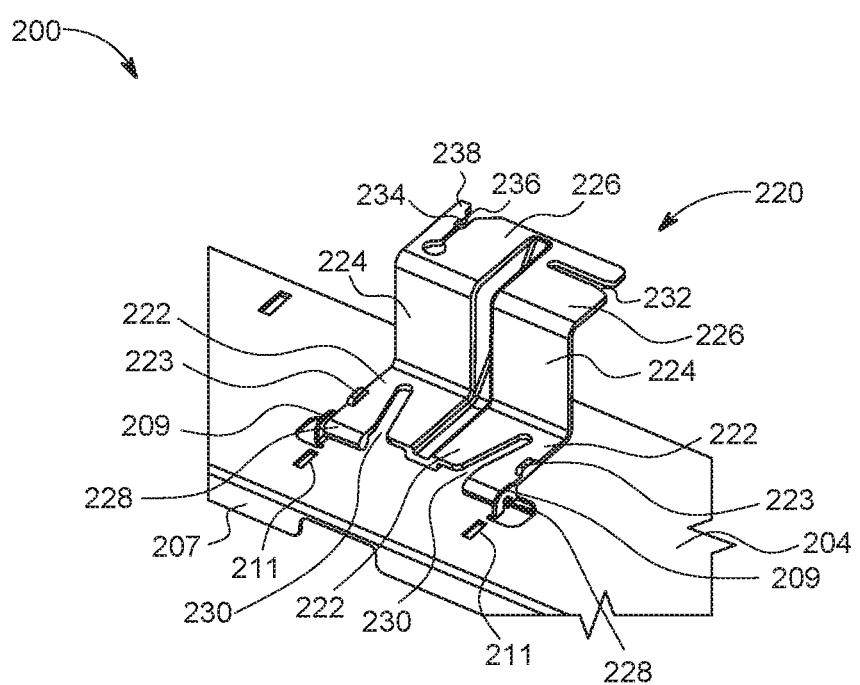
FIG. 3C is a perspective view of the bracket of FIG. 3A in another second orientation on the chassis of the cold plate transport tool.

The first portion 222 of the bracket 220 includes outward-facing pins 228 that engage flanges 209 in the top panel 204 of the chassis 202. In the embodiment shown in FIG. 1, the flanges 209 are formed by cutting a semicircular arc in the top panel 204 and bending a portion of the top panel 204 on a concave side of the semicircular arc outwardly from the top panel 204 along a line between ends of the semicircular arc. A bracket 220 is secured between two of the flanges 209 spaced apart in a facing relationship. The flanges 209 include apertures therethrough, and the outward-facing pins 228 are insertable into the apertures. The bracket 220 can rotate about the outward-facing pins 228 in the flanges 209 between a first orientation, shown in FIG. 3A, and a second orientation. FIG. 3B shows one possible second orientation in which the bracket 200 has rotated 90° about the outward-facing pins 228. FIG. 3C shows another possible second orientation in which the bracket has rotated 180° about the outward-facing pins 228. As we discussed in greater detail below, the brackets 220 can be moved from the first orientation shown in FIG. 3A to the second orientation shown in FIG. 3B, the second orientation shown in FIG. 3C, or another second orientation. The brackets 220 at least partially block access to the cold plates 102 when in the first orientation. Rotating the brackets 220 to a second orientation moves the brackets 220 away from the respective cold plates 102 such that a user can access the cold plates 102.

Referring primarily to FIG. 3B, the first portion 222 of the brackets 220 includes cutouts 230. The cutouts 230 facilitate bending of outward sections of the first portion 222 in the direction of arrows B when a force in the direction of arrows B is applied. For example, a user may grasp and squeeze edges of the first portion 222 to exert a force in the direction of arrows B. The outward sections of the first portion 222 can deflect inwardly such that the outward facing pins 228 disengage from the apertures in the flanges 209. As a result, the bracket 220 can be disconnected from the chassis 202. In at least one embodiment, the first orientation of the brackets 220 is a connected stat in which the brackets 220 are connected to the chassis 202 and the second orientation of the brackets 220 is a disconnected state in which the brackets 220 are removed from the chassis 202.

In at least one embodiment, the first portion 222 of the bracket 220 includes tabs 223 extending from a surface of the first portion 222 that is in a facing relationship with the top plate 204 of the chassis 202 when the bracket 220 is in the first orientation illustrated in FIG. 3A. The tabs 223 extend into slots 211 in the top plate 204 when the bracket 220 is in the first orientation shown in FIG. 3A. The engagement of the tabs 223 in the slots 211 prevents the outward sections of the first portion 222 from deflecting inwardly in the direction of arrows B when the bracket 220 is in the first orientation. As a result, the bracket 220 cannot be disconnected from the top plate 204 of the chassis 202 when the bracket 220 is in the first orientation. As will be discussed in greater detail below, a cold plate 102 is attached to the bracket 220 when the bracket is in the first orientation. If the bracket 220 with a cold plate 102 were to unintentionally detach from the top plate 204, then the cold plate 102 would be free to move relative to remaining cold plates 102. Ensuring the bracket 220 does not inadvertently disconnect from the top plate 204 when connected to a cold plate 102 can therefore ensure the cold plate 102 attached to the bracket 220 does not unintentionally move relative to the chassis 202.

The third portion 226 of the bracket 220 includes a first slot 232 and a second slot 234 configured to be attached to a cold plate 102. The first slot 232 is oriented along a first direction and the second slot 234 is oriented along a second direction. In the illustrated embodiment, the second direction is perpendicular to the first direction. As will be discussed below with reference to FIGS. 4A-4B and 5A-5C, the first slot 232 and the second slot 234 engage T-top posts of a cold plate 102 such that the cold plate 102 is attached to the bracket 220.

Figure 4A:
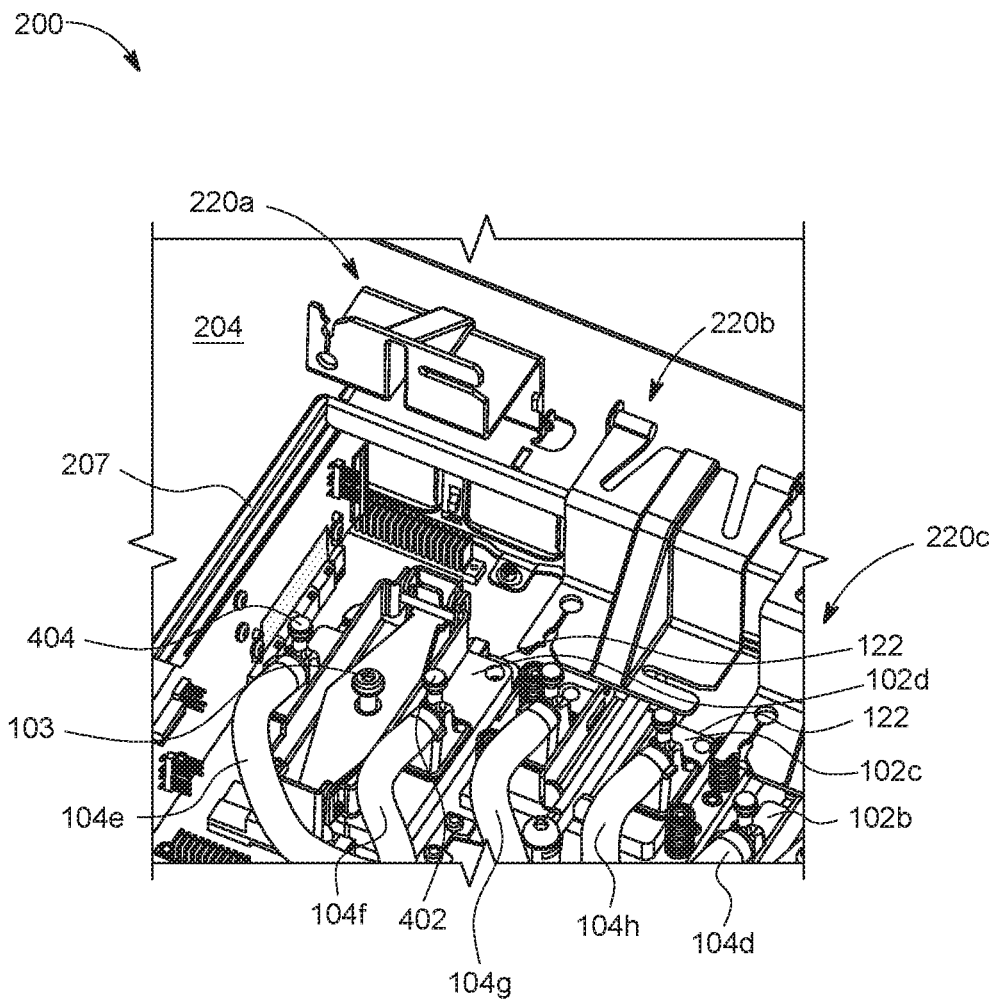
FIG. 4A is a partial top perspective view of the cold plate transport tool of FIG. 2A disposed on the electronics housing of FIG. 1B, wherein one bracket is moved to the second orientation.

FIG. 4A is a partial top perspective view of the cold plate transport tool 200 arranged on the electronics housing 120 such that the brackets 220 of the cold plate transport tool 200 are disposed above cold plates 102 of the cold plate assembly 100. FIG. 4A shows a first bracket 220a disposed above the fourth cold plate 102d, a second bracket 220b disposed over the third cold plate 102c, and a portion of a third bracket 220c disposed over a portion of the second cold plate 102b. In FIG. 4A, the second bracket 220b and the third bracket 220c are illustrated in the first orientation. In the first orientation, the second bracket 220b and the third bracket 220c are substantially aligned with and positioned above the third cold plate 102c and the second cold plate 102b, respectively. The first bracket 220a is illustrated in the second orientation shown in FIG. 3B. In the second orientation, the first bracket 220 is further from the fourth cold plate 102d than in the first orientation. The increased distance provided by the first bracket 220a in the second orientation provides access for a user to unsecure a fastener 103 attaching the fourth cold plate 102d to an electrical component 122 in the electronics housing 120.

Figure 4B:
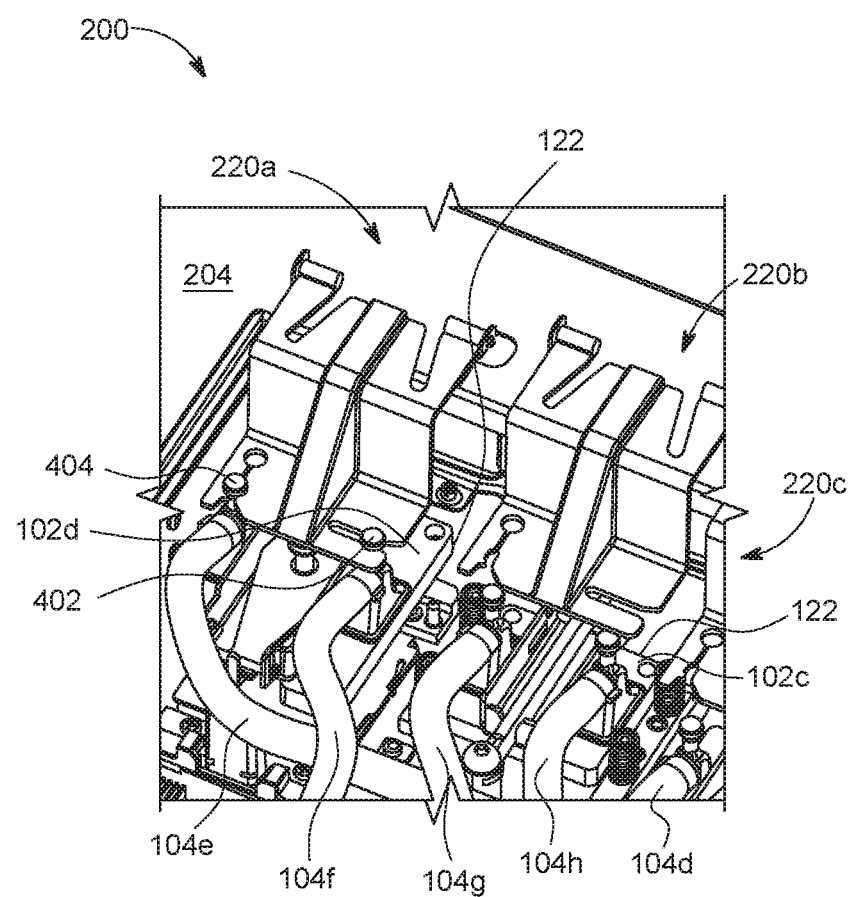
FIG. 4B is a partial top perspective view of the cold plate transport tool of FIG. 2A disposed on the electronics housing of FIG. 1B, wherein the bracket from FIG. 4A is moved to the first orientation and a cold plate of the cold plate assembly of FIG. 1A is attached to the bracket.

Referring now to FIG. 4B, after the user has unfastened the fourth cold plate 102d from the electrical components 122, the user may lift the fourth cold plate 102d off of the electrical components 122. The user may also rotate the first bracket 220a from the second orientation to the first orientation and engage T-top posts 402 and 404 of the fourth cold plate 102d with the first slot 232 and the second slot 234, respectively, in the first bracket 220a. Once the T-top posts 402 and 404 of the fourth cold plate 102d are engaged in the first slot 232 and the second slot 234, respectively, and the first bracket 220a is in the first orientation, the fourth cold plate 102d is positioned in a spaced apart manner from the electrical components 122 from which it was detached but otherwise in approximately the same position relative to the remaining cold plates 102 of the cold plate assembly 100. The amount of relative displacement between the fourth cold plate 102d and remaining cold plates 102 of the cold plate assembly 100 is small enough that the flexible hoses 104 can accommodate such displacement. After the fourth cold plate 102d is attached to the first bracket 220a, the remaining cold plates 102 of the cold plate assembly 100 are attached to other brackets 220 of the cold plate transport tool 200.

Figure 5A:
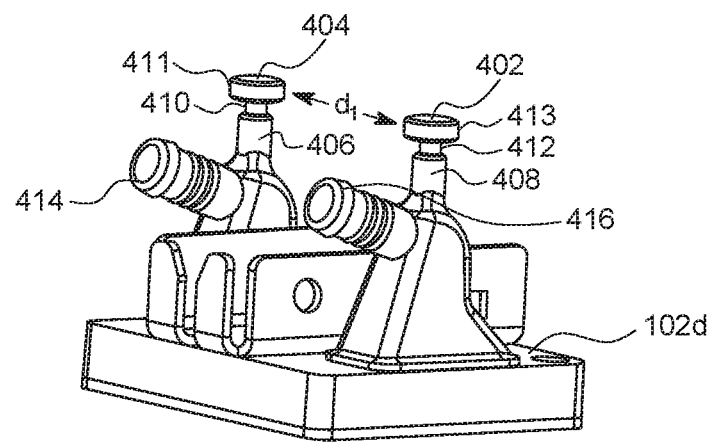
FIG. 5A is a perspective view of a portion of a cold plate of the cold plate assembly of FIG. 1A.

FIG. 5A is a detail perspective view of a portion of the fourth cold plate 102d that includes the T-top posts 402 and 404. The T-top posts 402 and 404 are mounted to fluid ports 416 and 414, respectively, that transport cooling fluid to and from the fourth cold plate 102d. The T-top posts 402 and 404 include bases 408 and 406, respectively, protruding from the respective fluid ports 416 and 414 along a first direction. The bases 408 and 406 include reduced-dimension posts 412 and 410, respectively, extending therefrom along the first direction. The reduced-dimension posts 412 and 410 have smaller dimensions than the bases 408 and 406, respectively, in a second direction that is perpendicular to the first direction. The reduced-dimension posts 412 and 410 are covered by caps 413 and 411, respectively. The caps 413 and 411 have a larger dimension in the second direction than the reduced-dimension posts 412 and 410, respectively. In the embodiment shown in FIG. 5A, the bases 408 and 406, the reduced-dimension posts 412 and 410, and the caps 413 and 411 are cylindrical. However, in other embodiments, the caps 413 and 410 could have other shapes, such as a square shaped, a triangle shaped, a pentagon shape, a hexagon shape, and octagon shape or another polygon shape. The dimensions of the reduced-dimension posts 412 and 410 in the second direction are smaller than a width dimension of the first slots 232 and 234 in the third portions 226 of the brackets 220. The bases 408 and 406 and the caps 413 and 411 of the T-top posts 402 and 404, respectively, have dimensions in the second direction that are larger than the width dimension of the first slot 232 and the second slot 234 in the third portions 226 of the brackets 220. When the reduced-dimension posts 412 and 410 are inserted into the slots 232 and 236, respectively, of the bracket 220, the bases 408 and 406 and the caps 413 411 prevent the T-top posts 402 and 404, respectively, from moving through the first slot 232 and the second slot 234, respectively, in a vertical direction.

Figure 5B:
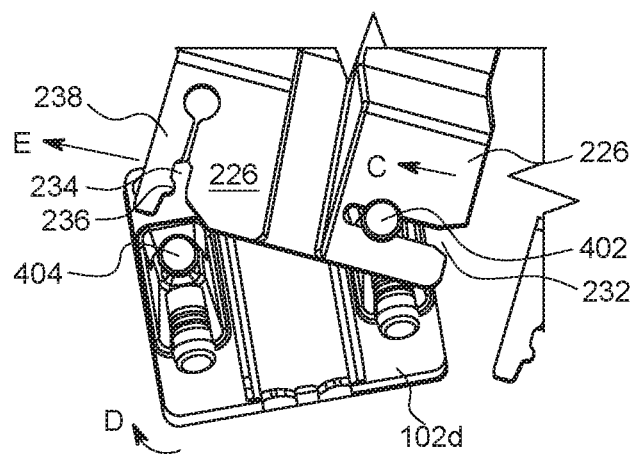
FIG. 5B is a top view of the cold plate of FIG. 5A partially attached to a bracket of the cold plate transport tool of FIG. 2A.
Figure 5C:
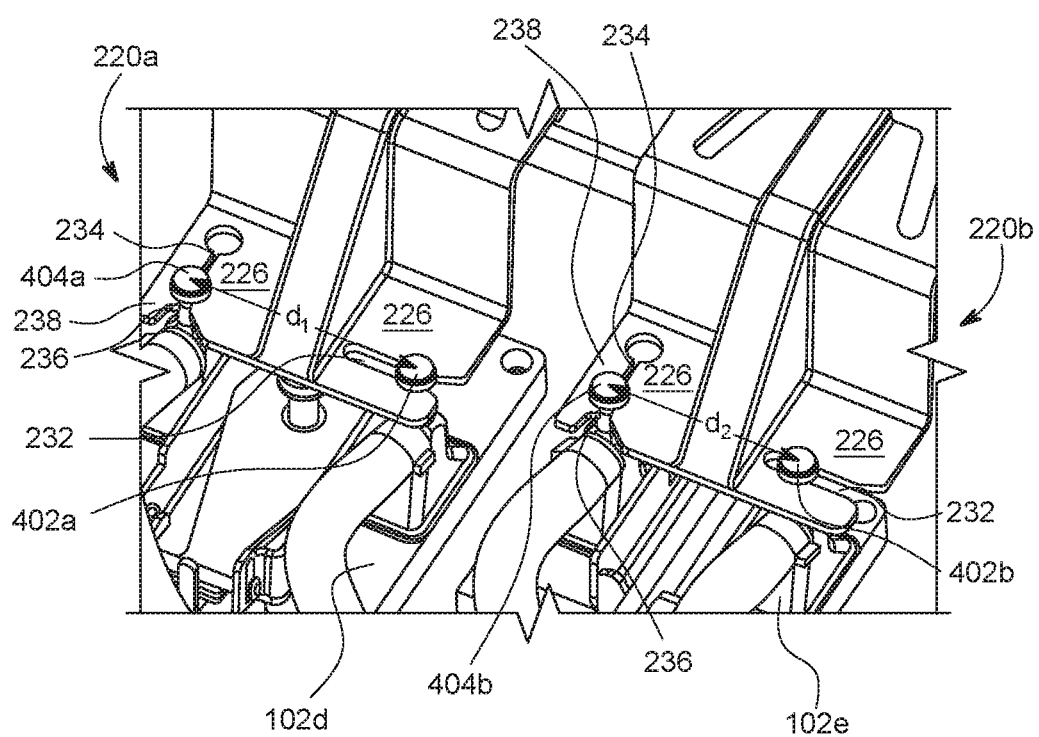
FIG. 5C is a partial top perspective view of the cold plate transport tool of FIG. 2A disposed on the electronics housing of FIG. 1B, wherein two cold plates of the cold plate assembly of FIG. 1A are attached to respective brackets of the cold plate transport tool.

FIGS. 5B and 5C are perspective views that illustrate how the T-top posts 402 and 404 of the fourth cooling bracket 102d are installed in the slots 232 and 234 of the bracket 220. First, the first T-top post 402 is inserted in the first slot 232 in the direction of arrow C. The first T-top post 402 is aligned with the third portion 226 of the bracket 220 such that the first reduced-dimension post 412 of the first T-top post 402 is aligned with the slot 232. Thereafter, the cold plate 102d is rotated in the direction of arrow D about the first T-top post 402 such that the second reduced-dimension post 410 of the second T-top post 404 is inserted into the second slot 232. The second slot 234 includes a notch 236. The notch 236 reduces the width of the slot 234 to a dimension that is less than the dimension of the second reduced-dimension post 410. For the second reduced-dimension post 410 to pass the notch 236, an outboard section 238 of the third portion 226 of the bracket 220 deflects from a relaxed position in the direction of arrow E. After the second reduced-dimension post 410 has passed the notch 236, the outboard section 238 returns to the relaxed position. As a result, the second reduced-dimension post 410 is retained in the second slot 234 by the notch 236. Furthermore, since the second slot 234 is oriented in a different direction than the first slot 232, the first reduced-dimension post 412 is retained in the first slot 232 by the positioning of the second reduced-dimension post 410 in the second slot 234.

FIG. 5C illustrates the fourth cold plate 102d attached to the first bracket 220a and the third cold plate 102c attached to the second bracket 220b. One advantage of having the first slot 232 and the second slot 234 of the respective brackets 220 oriented along different directions is that a single bracket design can accommodate pairs of T-top posts having different spacing. In at least one embodiment, the different cold plates 102 of the cold plate assembly 100 have different shapes and/or sizes to accommodate different electrical components. As a result, a distance between the fluid ports 414 and 416 may vary for the different cold plates 102. As a result, a distance between the T-top post 402 and 404 may also vary for the different cold plates 102. FIG. 5C shows that the T-top posts 402a and 404a of the fourth cold plate 102d are separated by a first distance $d_1$ and the T-top post 402b and 404b of the third cold plate 102c are separated by a second distance $d_2$. The second distance $d_2$ is smaller than the first distance $d_1$. The second T-top posts 404a and 404b are positioned within the respective second slots 234 in the same location past the notches 236. However, the first T-top post 402b of the third cold plate 102c is positioned further in the first slot 232 of the second bracket 220b than the first T-top post 402a of the fourth cold plate 102d is positioned in the first slot 232 of the first bracket 220a.

Figure 6A:
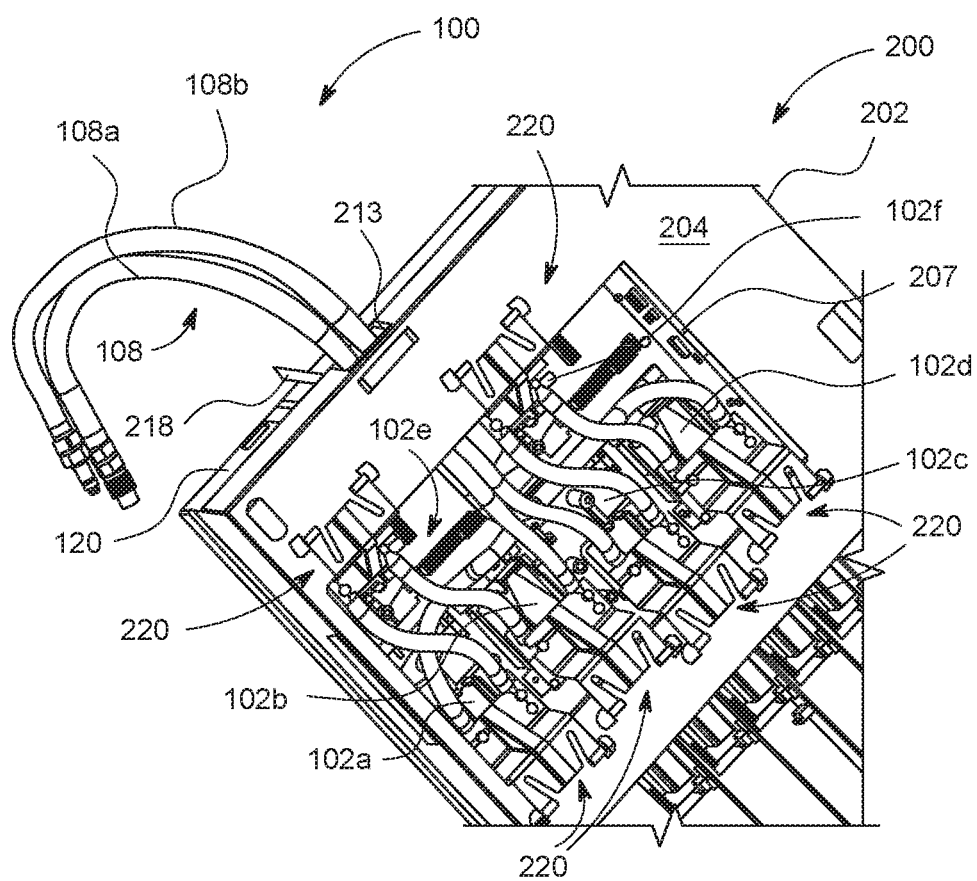
FIG. 6A is a partial top perspective view of the cold plate transport tool of FIG. 2A disposed on the electronics housing of FIG. 1B, wherein all of the cold plates of the cold plate assembly are attached to respective brackets of the cold plate transport tool

The individual cold plates 102 of the cold plate assembly 100 are attached one by one to brackets 220 of the cold plate transport tool 200 as described above with reference to FIGS. 4A-4B and 5A-5C. FIG. 6A illustrates the six cold plates 102 of the cold plate assembly 100 connected to the six brackets 220 of the cold plate transport tool 200. As discussed above, in at least one embodiment, the cold plate transport tool 200 could include additional, different attachment points for brackets 220 to accommodate use of the cold plate transport tool 200 with different types of electronics housings 120 in which the electrical components may be arranged differently. In addition to securing the cold plates 102 to the brackets 220, the supply hoses 108 and/or the junction 106 are secured relative to the chassis 202 of the cold plate transport tool 200 using the hook and loop fastener strap 218. The supply hoses 108 are positioned in the opening 213 of the chassis 202, and the hook and loop fastener strap 218 prevents the supply hoses 108 from falling out of the opening 213.

Figure 6B:
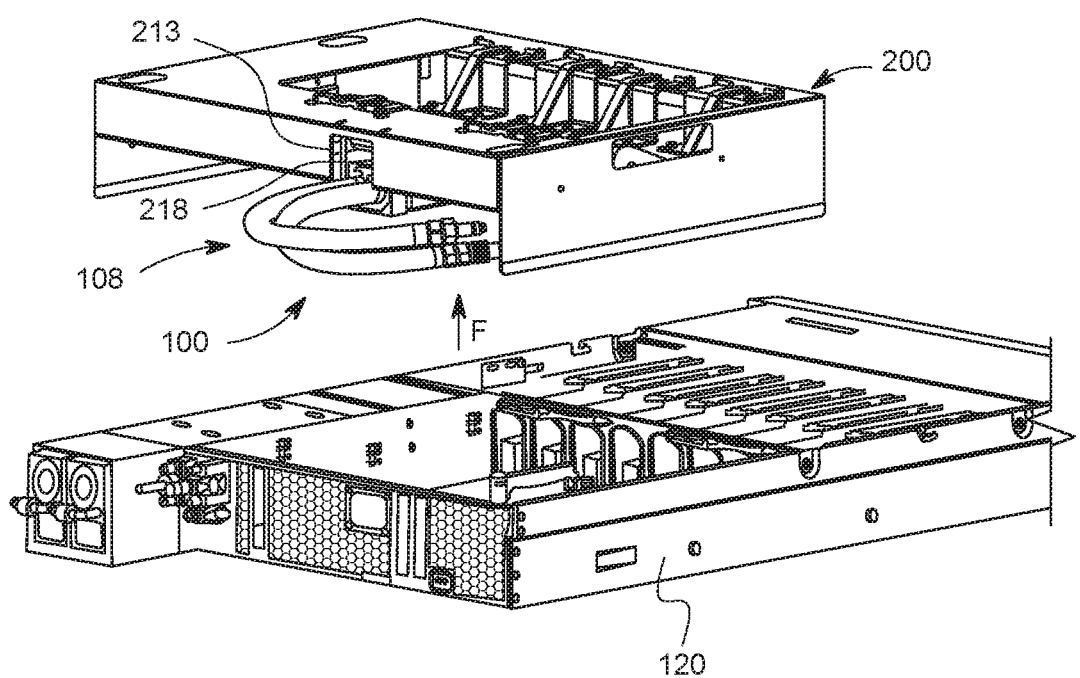
FIG. 6B is a perspective view of the cold plate transport tool of FIG. 2A removed from the electronics housing of FIG. 1B, wherein the cold plate assembly is removed with the cold plate transport tool.

Referring now to FIG. 6B, after the cold plates 120 are secured to the brackets 220 and the supply hoses 108 are secured in the opening 213 via the hook and loop fastener strap 218, the cold plate assembly 100 can be removed from the electronics housing 120 by lifting the cold plate transport tool 200 off of the electronics housing 120 in the direction of arrow F. The cold plate assembly 110 can then be transported for repair or replacement. As discussed above, the cold plate transport tool 200 enables a single person to safely remove the cold plate assembly 100 without assistance.

Figure 7:
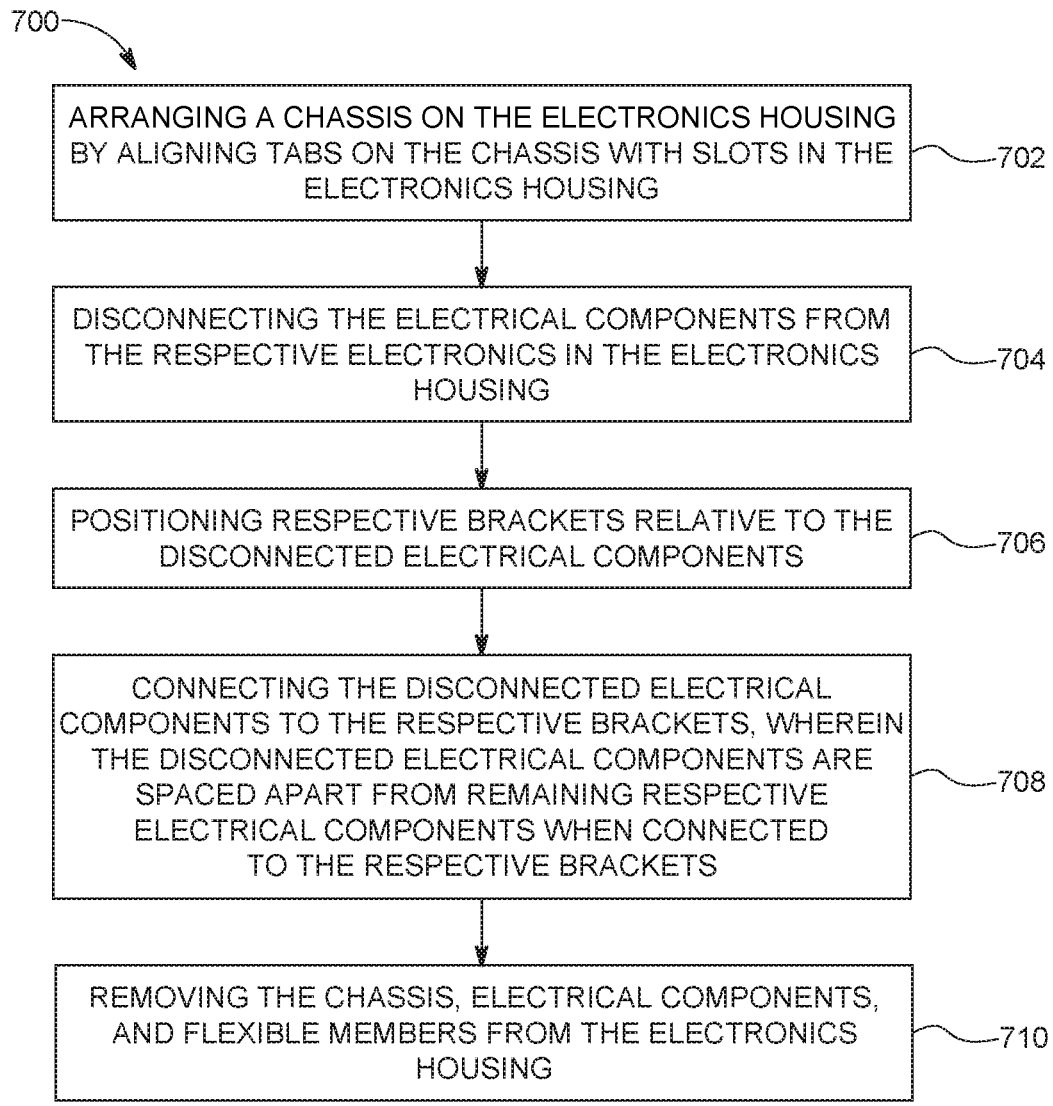
FIG. 7 is a flow chart of a method for removing electrical components from electronics housing, according to one embodiment.

FIG. 7 is a flowchart for a method 700 for removing an electrical apparatus, such as a cold plate assembly, from an electronics housing. In block 702 of the method, a chassis is positioned on the electronics housing by aligning tabs on the chassis with slots in the electronic housing. In block 704, respective ones of the electrical components are disconnected from the electronics in the electronics housing. In block 706, brackets are positioned relative to the disconnected electrical components. In block 708, the disconnected electrical components are connected to the respective brackets in a manner such that the disconnected electrical components are spaced apart from electrical components remaining in the electronics housing. In block 710, after all of the electrical components that are being removed are connected to respective brackets, the chassis, with the electrical components attached thereto, is removed from the electronics housing.

The above-described cold plate transport tool 200 can also be used in reverse order to re-install the cold plate assembly 100 into the electronics housing 120. For example, after the cold plate assembly 100 has been repaired, replaced, and/or inspected, the cold plate assembly 100 could be reinstalled in the cold plate transport tool 200 such that the cold plates 102 of the cold plate assembly 100 are attached to the respective brackets 220. Thereafter, the cold plate transport tool 200 can be repositioned on the electronics housing 120. Then, one at a time, the cold plates 102 can be removed from the respective brackets 220 and the respective brackets 220 can be moved to the second orientations such that the user can reattach the cold plates 102 to the electronic components 122 in the electronics housing 120. After all of the cold plates 102 of the cold plate assembly 100 are reinstalled in the electronics housing 120, the cold plate transport tool 200 can be removed from the electronics chassis 120. Again, the above-described installation process can be performed by a single user without any assistance.

In the above described embodiments, the electrical components being removed from an electronics housing are cold plates of a cold plate assembly. However, the described apparatus and method could be applicable to other electrical components. For example, certain data cards (e.g., graphics cards, sound cards, networking cards, and interface cards), power supplies, and/or other electrical components within electronics housing may be connected by wires and/or cables, and disconnecting the wires and/or cables connecting the electrical components prior to removal from the electronics housing may be impractical or impossible. In such circumstances, a transport tool could include brackets that connect to the various electronic components such that the transport tool can simultaneously remove all of the connected electronic components simultaneously.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing is directed to embodiments of the present disclosure, other and further embodiments of the invention may be devised without departing from the basic scope thereof, and the scope thereof is determined by the claims that follow.

What is claimed is:

1. A method for transferring an electrical apparatus from an electronics housing, wherein the electrical apparatus includes a plurality of electrical components that are rigidly connected to electronics in the electronics housing and connected to each other via flexible members, the method comprising:

arranging a chassis on the electronics housing by aligning and engaging tabs on the chassis with slots in the electronics housing;

disconnecting the electrical components from the respective electronics in the electronics housing;

positioning respective brackets relative to the disconnected electrical components, the respective brackets disposed on the chassis at locations corresponding to the locations of the electrical components within the electronics housing when the chassis is aligned with the electronics housing;

attaching the disconnected electrical components to the respective brackets, the attaching including:
  moving each respective bracket between a second orientation and a first orientation, each respective bracket closer to the respective electrical components in the first orientation than in the second orientation,
  engaging and inserting a T-post of a respective electrical component into a first slot of a respective bracket, the first slot orientated along a first direction, and
  engaging and inserting a second T-post of the respective electrical component into a second slot of the respective electrical component, the second slot orientated along a second direction perpendicular to the first direction, wherein the disconnected electrical components are spaced apart from remaining respective electrical components when attached to the respective brackets; and removing the chassis, electrical components, and flexible members from the electronics housing.

2. The method of claim 1, wherein the brackets are coupled to the chassis in a rotatable manner.

3. The method of claim 1, wherein the brackets are detachable from the chassis, and wherein positioning the brackets relative to the disconnected electrical components comprises attaching the respective brackets to the chassis.

4. The method of claim 1, further comprising securing at least one flexible member relative to the chassis.

5. An apparatus for installing components in an electronics housing, comprising:
  a chassis comprising a plurality of tabs, each of the tabs configured to engage respective ones of a plurality of slots in the electronics housing, wherein the chassis is aligned with the electronics housing when the tabs are engaged in the respective slots; and
  a plurality of brackets disposed on the chassis, wherein the respective ones of the plurality of brackets are:
    configured to be attached to respective electrical components in the electronics housing;
    disposed on the chassis at locations corresponding to locations of the respective electrical components within the electronics housing when the chassis is aligned with the electronics housing; and
    selectively movable between a first orientation and a second orientation, and wherein the respective brackets are closer to the respective electrical components in the first orientation than in the second orientation; and
  wherein the plurality of brackets each include:
    a first slot oriented along a first direction configured to engage a first T-top post of an electrical component; and
    a second slot oriented along a second direction that is perpendicular to the first direction, wherein the second slot is oriented to engage a second T-top post of the electrical component, and wherein the electrical component is installed on the bracket by inserting the first T-top post into the first slot and then sliding the second T-top post into the second slot.

6. The apparatus of claim 5, wherein the first orientation is an unrotated position and the second orientation is a rotated position, wherein the brackets are positioned over the electrical components installed in the electronics housing in the unrotated positions, and wherein the brackets are positioned away from the electrical components in the rotated positions.

7. The apparatus of claim 5, wherein the first orientation is an attached state and the second orientation is a detached state, wherein the brackets are connected to the chassis in the attached state, and wherein the brackets are disconnected from the chassis in the detached state.

8. The apparatus of claim 7, wherein the brackets are attachable to different locations of the chassis to accommodate different electrical component locations.

9. The apparatus of claim 5, wherein the second slot includes a detent, wherein the bracket deforms to enable the second T-top post to pass the detent, and wherein the detent retains the second T-top post in the second slot.

10. The apparatus of claim 5, wherein the brackets comprise plastic.

11. An apparatus for installing components in an electronics housing, comprising:
  a chassis comprising a plurality of tabs, each of the tabs configured to engage respective ones of a plurality of slots in the electronics housing, wherein the chassis is aligned with the electronics housing when the tabs are engaged in the respective slots; and
  a plurality of brackets disposed on the chassis, wherein the respective ones of the plurality of brackets are:
    configured to be attached to respective electrical components in the electronics housing;
    disposed on the chassis at locations corresponding to the locations of the respective electrical components within the electronics housing when the chassis is aligned with the electronics housing; and
  selectively movable between a first orientation and a second orientation, and wherein the respective brackets are closer to the respective electrical components in the first orientation than in the second orientation; and
  wherein the plurality of brackets comprise at least one of: a plastic and a glass-filled polycarbonate.

12. The apparatus of claim 11, wherein the chassis comprises one of steel or aluminum.

13. A cold plate apparatus, comprising:
  a cold plate assembly, comprising:
    a plurality of cold plates, wherein respective ones of the plurality of cold plates are connected to at least one other of the respective ones of the plurality of cold plates via flexible hoses;
  a cold plate transport tool configured to transport the cold plate assembly to and from an electronics housing, the cold plate transport tool comprising:
    a chassis comprising a plurality of tabs, each of the tabs configured to engage respective ones of a plurality of slots in the electronics housing, wherein the chassis is aligned with the electronics housing when the tabs are engaged in the respective slots; and
    a plurality of brackets disposed on the chassis, wherein the respective ones of the plurality of brackets are:
      configured to be attached to respective ones of the plurality of cold plates;
      disposed on the chassis at locations corresponding to the locations of the respective electrical components within the housing when the chassis is aligned with the electronics housing; and selectively movable between a first orientation and a second orientation, and wherein the respective brackets are closer to the respective cold plates in the first orientation than in the second orientation.

14. The cold plate apparatus of claim 13, wherein the first orientation is an unrotated position and the second orientation is a rotated position, wherein the brackets are positioned over the cold plates installed in the electronics housing in the unrotated positions, and wherein the brackets are positioned away from the cold plates in the rotated positions.

15. The cold plate apparatus of claim 13, wherein the first orientation is an attached state and the second orientation is a detached state, wherein the brackets are connected to the chassis in the attached state, and wherein the brackets are disconnected from the chassis in the detached state.

16. The cold plate apparatus of claim 13, wherein the plurality of brackets each include:
   a first slot oriented along a first direction configured to engage a first T-top post of an electrical component; and
   a second slot oriented along a second direction that is perpendicular to the first direction, wherein the second slot is oriented to engage a second T-top post of the electrical component, and wherein the electrical component is installed on the bracket by inserting the first T-top post into the first slot and then sliding the second T-top post into the second slot.

17. The cold plate apparatus of claim 16, wherein, for each of the plurality of cold plates:
   the first T-top post is mounted to a first flexible hose mount attached to the cold plate, wherein the first hose mount is configured to supply liquid to the cold plate; and
   the second T-top post is mounted to a second flexible hose mount attached to the cold plate, wherein the second hose mount is configured to remove liquid from the cold plate, wherein distances between the first T-top post and the second T-top post are different for different ones of the plurality of cold plates such that the first T-top posts of the different cold plates are positioned at a different location in the respective first slots when the second T-top posts are inserted into the second slots.

18. The cold plate apparatus of claim 16, wherein the second slot includes a detent, wherein the bracket deforms to enable the second T-top post to pass the detent, and wherein the detent retains the second T-top post in the second slot.

19. The cold plate apparatus of claim 13, wherein the plurality of brackets comprise at least one of: a plastic and a glass-filled polycarbonate.

20. The cold plate apparatus of claim 13, wherein the chassis comprises one of steel or aluminum.

* * * * *